United States Patent
Chan et al.

(10) Patent No.: US 7,170,799 B2
(45) Date of Patent: Jan. 30, 2007

(54) SRAM AND DUAL SINGLE ENDED BIT SENSE FOR AN SRAM

(75) Inventors: Yuen H. Chan, Poughkeepsie, NY (US); Timothy J. Charest, West Hurley, NY (US); Rajiv V. Joshi, Yorktown Heights, NY (US); Antonio Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/055,416

(22) Filed: Feb. 10, 2005

(65) Prior Publication Data

US 2006/0176732 A1 Aug. 10, 2006

(51) Int. Cl.
*G11C 7/00* (2006.01)
(52) U.S. Cl. .................... 365/190; 365/208; 327/51
(58) Field of Classification Search ............ None
See application file for complete search history.

(56) References Cited

U.S. PATENT DOCUMENTS

| 5,850,359 | A  | * | 12/1998 | Liu ........................... 365/156 |
| 6,608,786 | B2 | * | 8/2003  | Somasekhar et al. ....... 365/203 |
| 6,801,463 | B2 | * | 10/2004 | Khellah et al. ............. 365/203 |
| 2005/0128844 | A1 | * | 6/2005 | Yamagami .................. 365/207 |

* cited by examiner

*Primary Examiner*—Son L. Mai
(74) *Attorney, Agent, or Firm*—Law Office of Charles W. Peterson, Jr.; Louis J. Percello, Esq.; Satheesh K. Karra, Esq.

(57) ABSTRACT

A CMOS static random access memory (SRAM) and a bit select for the SRAM. The bit select includes a dual single-ended sense receiving a difference signal on a bit line pair and selectively sensing signals developing on each bit line independently of the other. Single ended outputs from the dual-ended sense are provided to an output driver. The output driver provides a pair of selectively-complementary output signals.

26 Claims, 4 Drawing Sheets

SRAM AND DUAL SINGLE ENDED BIT SENSE FOR AN SRAM

CROSS REFERENCE TO RELATED APPLICATION

The present invention is related to U.S. patent application Ser. No. 10/436,432, entitled "Coupled Body Contacts for Differential Circuits in SOI" to Yuen H. Chan et al., published as US 2004/0228160 A1 filed May 12, 2003, and published Nov. 18, 2004; U.S. patent application Ser. No. 10/644,211, entitled "Method Of Reducing Leakage Current In Sub One Volt SOI Circuits" to Richard B. Brown et al., filed Aug. 22, 2003; and, U.S. patent application Ser. No. 10/950,940, entitled "Integrated Circuit Chip With Improved Array Stability" to Yuen H. Chan et al., filed Sep. 27, 2004, all assigned to the assignee of the present invention.

FIELD OF THE INVENTION

The present invention is related to integrated circuit (IC) memory and, more particularly to circuits for accessing data stored in static random access memory (SRAM) arrays.

BACKGROUND DESCRIPTION

Integrated circuits (ICs) are commonly made in the well-known complementary insulated gate field effect transistor (FET) technology known as CMOS. CMOS technology and chip manufacturing advances have resulted in a steady decrease of chip feature size to increase on-chip circuit switching frequency (circuit performance) and the number of transistors (circuit density). In what is typically referred to as scaling, device or FET features are shrunk to shrink corresponding device minimum dimensions including both horizontal dimensions (e.g., minimum channel length) and vertical dimensions, e.g., channel layer depth, gate dielectric thickness, junction depths and etc. Shrinking device size increases device density and device performance, as well as reduces device-operating conditions, i.e., chip and correspondingly, device supply voltages and voltage swings. Consequently, as a result of scaling, otherwise seemingly neglectable device-to-device variations (e.g., length, width, threshold and etc.) have caused serious design problems, especially in signal critical circuits such as memory sense amplifiers.

A typical CMOS circuit includes paired complementary devices, i.e., an N-type FET (NFET) paired with a corresponding P-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa. So, for example, a CMOS inverter is a series connected PFET and NFET pair that are connected between a power supply voltage (Vdd) and ground (GND).

An ideal static random access memory (SRAM) cell includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects the cell, connecting the cell contents to the corresponding complementary pair of bit lines. An N by M SRAM array is organized as N rows of word lines by M columns of line pairs. Accessing a K bit single word (for a read or a write) from the array entails driving one of the N word lines. During a read, each cell on the selected word line couples its contents to its corresponding bit line pair through NFET pass gates. Each cell on a selected column line may be coupled to a simple sense amplifier (sense amp); ideally, a matched pair of cross-coupled common-source devices connected between a bit line pair and an enable source line. Since the bit line pair is typically pre-charged to some common voltage, initially, the internal (to the cell) low voltage rises until one of the bit line pairs droops sufficiently to develop a small difference signal (e.g., 30 mV) on the bit line pair.

Since a design shape printed and formed at different locations always has some variation, albeit minor variation, in the way it prints, imbalances in a matched cell device pair or a matched sense amp pair is inevitable. These imbalances unbalance the pair and may seriously erode the sense signal margin and even cause data sense errors. This erosion may be worse still in a partially depleted (PD) silicon on insulator (SOI) CMOS SRAM cells and circuits, because PD SOI devices are subject to what is known as floating body effects. Floating body effects, also known simply as body effects or as history effects, occur in completely or partially isolated (e.g., where body resistance may have rendered body contacts ineffective) devices, where the device substrate or body is floating or essentially floating. As a floating body device switches off, charge (i.e., from majority carriers) remains in the device body beneath the channel. Device leakage and parasitic bipolar effects may add to the charge. Charge builds at isolated devices as the chip operates because the charge from fast switching devices is injected into locally isolated body pockets faster than it dissipates. Eventually, the injected charge reaches some steady state value that acts as a substrate bias, e.g., shifting the threshold voltage ($V_T$) for the device. This steady state change depends upon each particular device's switching history and so is also known as the history effects for the particular device. The result of the body effects may be that two identical-by-design adjacent devices exhibit some difference that may be time varying, e.g., from changing circuit conditions during read and write operations. Consequently, the initial states of cell transistors (cell history) as well as gate-to-body tunneling current (that may further imbalance cell symmetry) can be critical to cell stability. Thus, body effects can unbalance a matched pair of devices in a sense amp, for example. The inadequately balanced sense amplifier may read a signal that is not there or self-trigger, sensing before the signal has developed, e.g., to read a residual signal from a partial prior restore.

Thus, there is a need for improved SRAM data sense reliability, and especially for an improved SRAM data sense circuit for PD SOI CMOS SRAMs with reduced sensitivity to body effects, local device variations, mismatches in matched device pairs and increases in device body resistance.

SUMMARY OF THE INVENTION

It is a purpose of the invention to improve SRAM sensing reliability;

It is another purpose of the invention to reduce SRAM sensitivity to device mismatch in the data path.

The present invention relates to a CMOS static random access memory (SRAM) and to a bit select for the SRAM. The bit select includes a dual single-ended sense receiving a difference signal on a bit line pair and selectively sensing signals developing on each bit line independently of the other. Single ended outputs from that dual-ended sense are provided to an output driver. The output driver provides a pair of selectively-complementary output signals.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
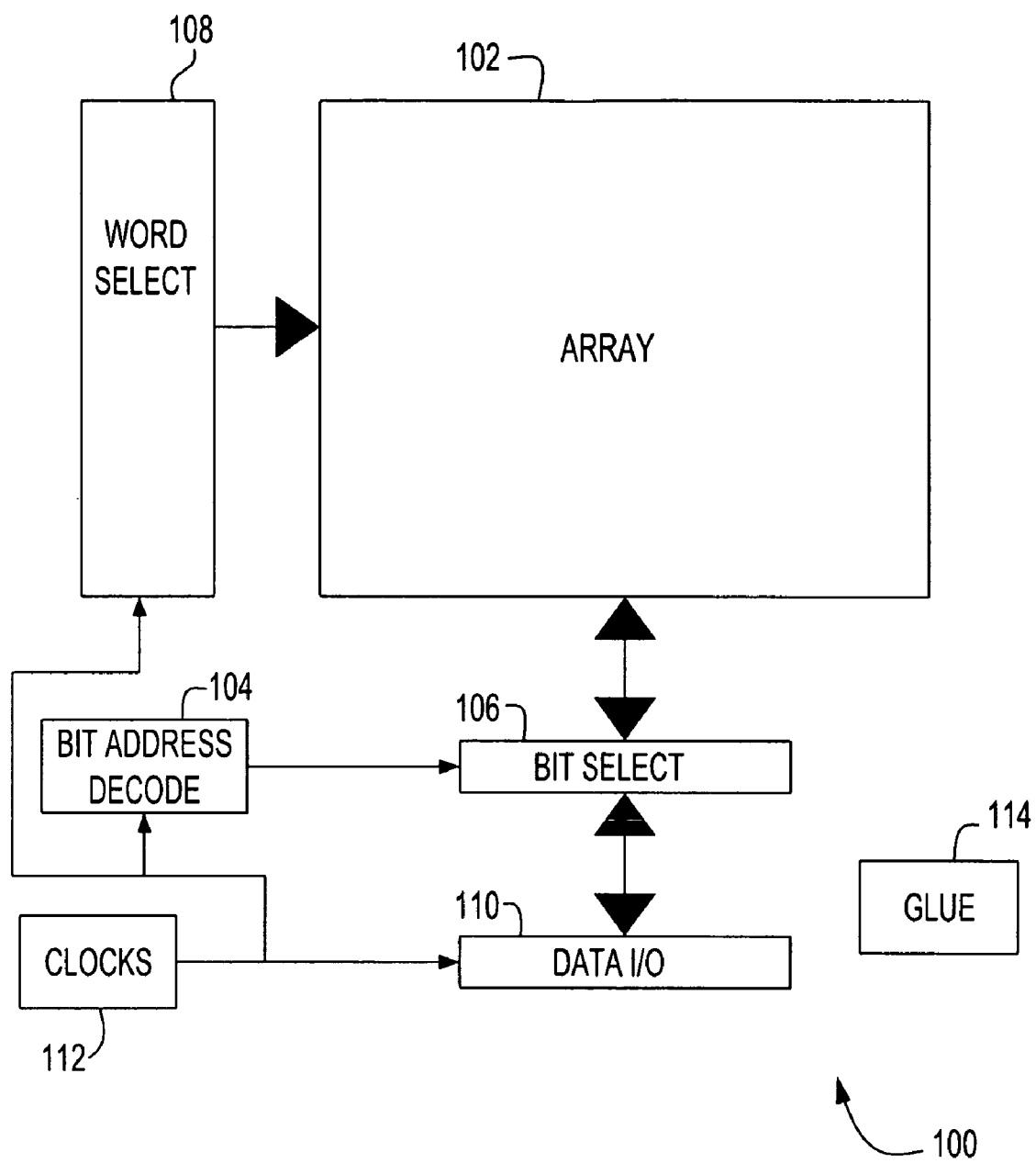
FIG. 1 shows a block diagram example of a preferred embodiment memory, macro or chip data path.

Turning now to the drawings and, more particularly, FIG. 1 shows a block diagram example of a preferred embodiment memory, e.g., a static random access memory (SRAM) macro or chip 100. Bit address decode 104 to the preferred bit select circuit 106 selects a pair of bit lines (an array column) and, during a read, both of the selected are sensed completely independently of the other, i.e., single ended as opposed to differentially. Preferably, the SRAM is in a standard insulated gate field effect transistor (FET) technology. More particularly, the SRAM is in the complementary FET technology that is commonly referred to as CMOS and, most preferably in multi-threshold CMOS (MTCMOS). In this example, cells (not shown) of an array 102 are selected by coincidence a column (selected by the preferred bit select circuit 106) with a row (i.e., a word line) selected by word decoder 108. Data input/output (I/O) drivers 110 pass data to and from the preferred select circuit 106. Thus during a read, I/O drivers 110 re-drive both single ended results from the preferred select circuit 106; and during a write, I/O drivers 110 provide data to the preferred select circuit 106. Clock logic 112 provides local timing (e.g., to synchronize the SRAM 100 to other chip circuits) and glue logic 114 provides local control logic.

Figure 2:
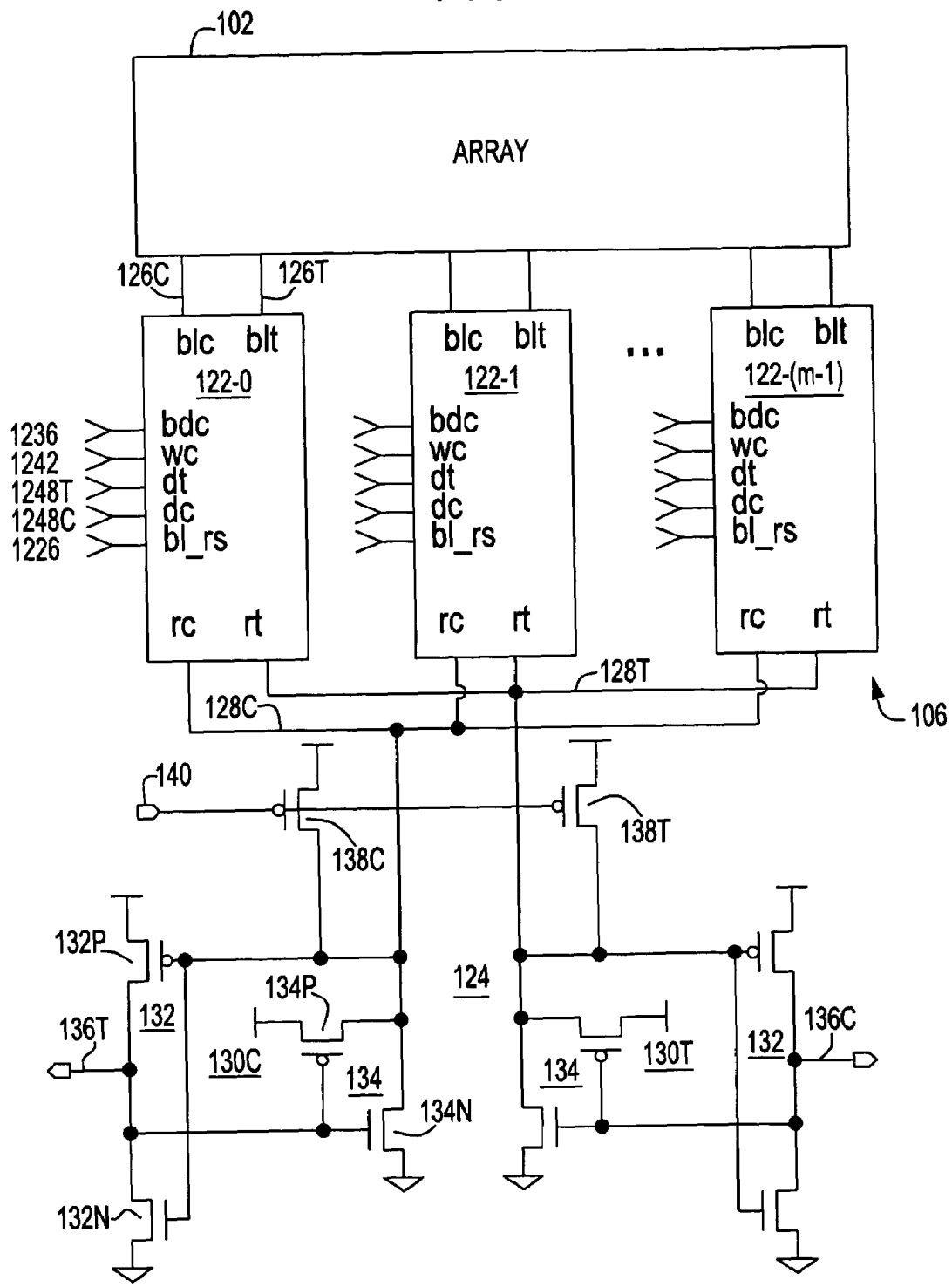
FIG. 2 shows an example of a data path cross section from the SRAM array through a column selected by a bit select circuit and through a data output driver.

FIG. 2 shows an example of a data path cross section 120 from an array 102 through a column selected by a corresponding bit select circuit 122-0, 122-1, . . . , 122-(m−1) in the preferred bit select circuit (e.g., 106 of SRAM 100 of FIG. 1) and a data output driver 124, e.g. in data I/O drivers 110. A pair of bit lines 126T, 126C from array 102 connects a column of cells to each bit select circuit 122-0, 122-1, . . . , 122-(m−1). Each bit select circuit 122-0, 122-1, . . . , 122-(m−1) selectively drives data contents from the array 102 on one of output pair 128T, 128C to the data output driver 124. The output data driver 124 includes a pair of latches 130T, 130C connected to a corresponding one of the select output pair 128T, 128C. Each of the pair of latches 130T, 130C includes a pair of cross coupled inverters (e.g., 132, 134), driving select outputs 136T, 136C selectively-complementary. Preferably, one or both the cross coupled inverters 132, 134 (e.g., 132) are skewed inverters with a high threshold ($V_{T+}$) N-type FET (NFET) 132N, 134N (e.g., 0.2V, higher than design nominal or normal) paired with a corresponding normal $V_T$ P-type FET (PFET), 132P, 134P.

Read enable/reset devices 138C, 138T are PFETs in this example, gated by a read select signal 140.

The increased threshold weakens the NFET drive current (i.e., $V_{GS}-V_T$ is reduced) such that PFETs 138C and 138T need not be inordinately large to match the NFET 134N current and so, shifts the latch 130C, 130T switching point to facilitate setting each of the latches 130C, 130T independent of the state of the other. For examples of selectively forming high threshold devices, see, e.g., U.S. patent application Ser. No. 10/644,211, entitled "Method Of Reducing Leakage Current In Sub One Volt SOI Circuits" to Richard B. Brown et al., filed Aug. 22, 2003, U.S. patent application Ser. No. 10/950,940, entitled "Integrated Circuit Chip With Improved Array Stability" to Yuen H. Chan et al., filed Sep. 27, 2004, both assigned to the assignee of the present invention and incorporated herein by reference.

In a typical SRAM array organized N words by M columns by K data bits, the array may be further organized with a single data output driver 124 for each data bit and M bit select circuits 122-0, 122-1, . . . , 122-(m−1) dot connected together at the select output pair 128T, 128C. Normally, both of the select output pair 128T, 128C are in high impedance (Hi-Z) and, except during a read, reset select signal 140 is low to turn on both reset PFETs 138C, 138T, clamping both select outputs 128T, 128C high. With both select outputs 128T, 128C clamped high, both selectively-complementary data outputs 136T, 136C are low. A read begins with reset select 140 going high to float select outputs 128T, 128C. As noted hereinabove, one bit pair of bit lines 126T, 126C is selected from array 102 by selecting of one of the bit select circuits 122-0, 122-1, . . . , 122-(m−1). One of the select outputs 128T, 128C is driven low to set the corresponding latch 130T, 130C and, thereby drive a corresponding one of selectively-complementary data outputs 136T, 136C high. Thereafter, the select outputs 128T, 128C may return to Hi-Z, while the latches 130T, 130C hold the data value until the reset select 140 is driven low to reset the latches 130T, 130C.

Figure 3:
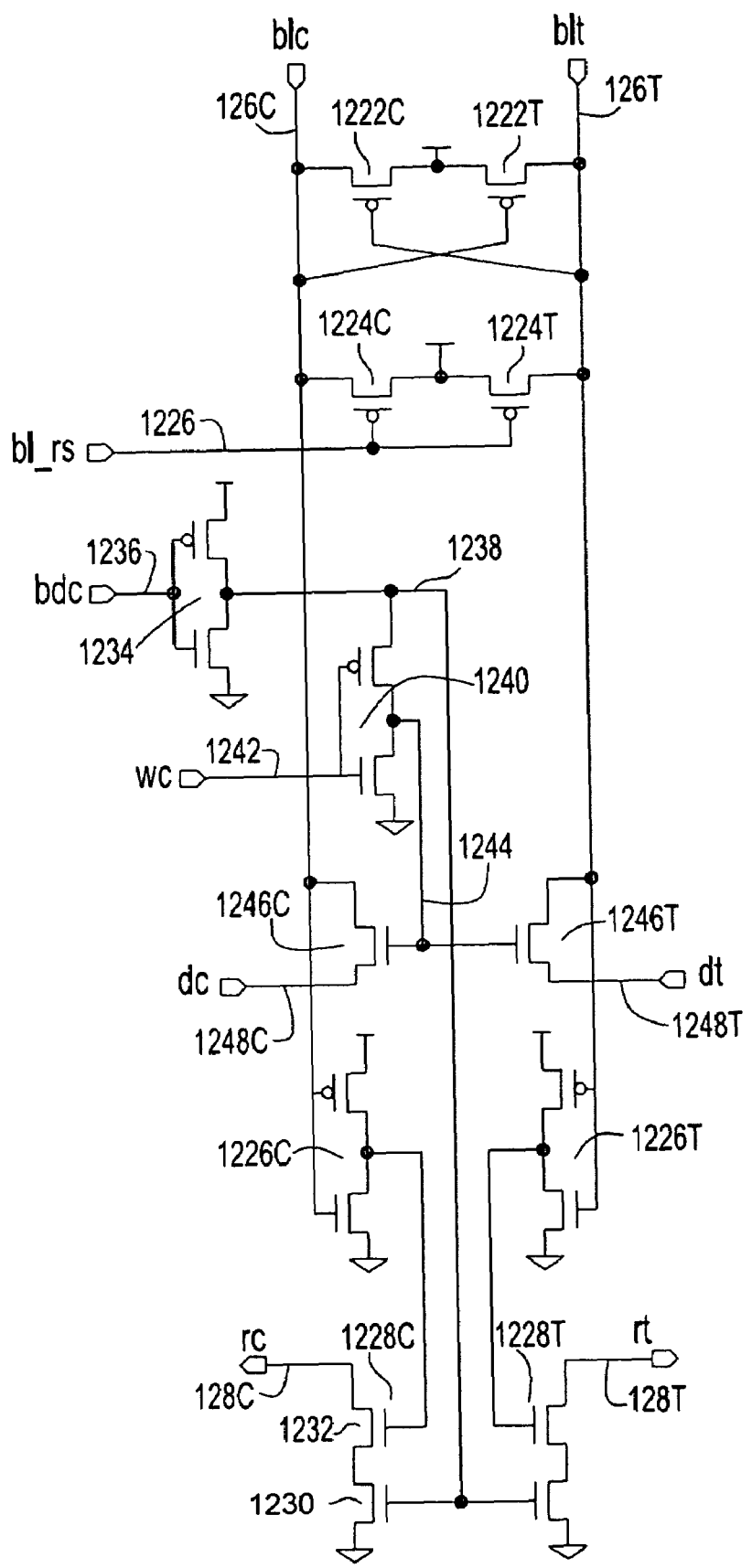
FIG. 3 shows an example a preferred single bit select circuit.

FIG. 3 shows an example a single preferred bit select 122 a dual single-ended sense. A preferred single bit select circuit 122 selectively senses a signal developing on either of the bit line pair 126C, 126T, independently of a signal or lack thereof developing and being sensed on the other of the pair. Bit lines 126C, 126T from the array (e.g., 102 in FIGS. 1 and 2) connect to a pair of cross-coupled PFETs 1222C, 1222T and restore PFETs 1224C, 1224T, which are gated by bit line restore signal 1226. Each PFET 1222C, 1222T and 1224C, 1224T is connected drain to source between a respective one of the bit lines 126C, 126T and a supply, e.g., $V_{DD}$. Each of the bit lines 126C, 126T drive a skewed inverter 1226C, 1226T, which are substantially similar to skewed inverters 132, 134 in FIG. 2. The outputs of each of skewed inverters 1226C, 1226T are an input to a two input (2-way) NAND gates 1228C, 1228T, which are floating open drain gates and connected to select outputs 128C, 128T, respectively. Each of the open drain NAND gates 1228C, 1228T includes a pair of series connected NFETs (e.g., 1230, 1232), connected between a respective one of floating select outputs 128C; 128T and ground. An inverter 1234 receives a bit decode signal 1236 (e.g., from bit address decode 104). The bit select output 1238 of inverter 1234 is the other input to each of the open drain NAND gates 1228C, 1228T. The bit select output 1238 also acts as a switched supply voltage for an inverter 1240 that is driven by a write select signal 1242 and provides a write enable output 1244. Effectively, the write enable output 1244 is the NOR of the bit decode signal 1236 and the write select signal 1242. The write enable 1244 gates a pair of NFET pass gates 1246C, 1246T that are each connected between one of the complementary bit lines 126C, 126T and a corresponding complementary pair of data inputs 1248C, 1248T.

Figure 4:
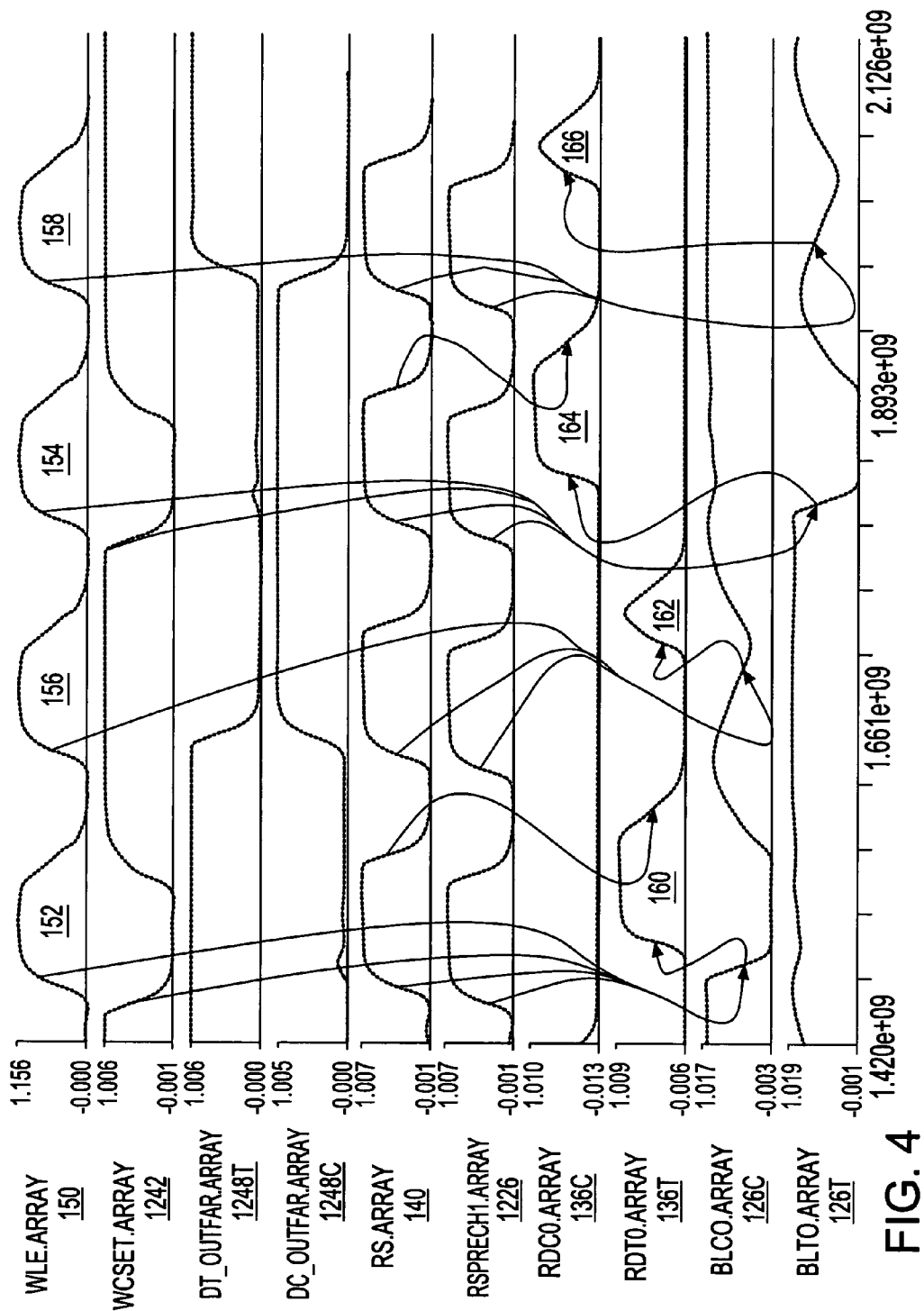
FIG. 4 shows an example of a timing diagram through the SRAM data path for accessing cells on a single word line.

FIG. 4 shows an example of a timing diagram through the data path for accessing cells on a single word line 150 in array 102 with reference to the cross sections of FIGS. 2 and 3. In this example, two write accesses 152, 154, are each followed by a read access, 156, 158, of the same location. When the word line 150 goes high during each access 152, 154, 156, 158, reset signals 140, 1226, are also driven high, turning off PFETs 138C, 138T and 1224C, 1224T, respectively. With PFETs 138C, 138T, 1224C and 1224T off, both the bit lines 126C, 126T and the select outputs 128C, 128T are floating, pre-charged high. Thus, when the write select signal 1242 falls during the write accesses, 152, 154, inverter 1240 drives the write enable output 1244 high to turn on NFET pass gates 1246C, 1246T, which couples the contents of the complementary pair of data inputs 1248C, 1248T to the bit lines 126C, 126T. During each write, one of the bit lines (e.g., 126C in 152) is pulled low and the other (126T) remains high. Cross-coupled PFETs 1222C, 1222T prevent early reads, e.g., from the word line 150 selecting a connected cell prior to asserting the write signal 1242. So, as the complementary bit line 126C falls, only the output of the corresponding inverter 1226T rises and is combined (NANDed) in NAND gate 1228C with bit select output 1238 to pull select output 128C low. As noted above with respect to data output driver 124, when select output 128C falls, it sets latch 130C, which drives output 136T high in pulse 160 with output 136C, 136T providing complementary signals until the word line 150 falls and the data path is reset.

During the reset, both bit lines 126C, 126T are pulled high, which assures that the output is low for both inverters 1226C, 1226T. So, regardless of the bit select signal, NAND gates 1228C, 1228T are off. Similarly, with reset 140 low, PFETs 138C, 138T are on, resetting the latches 130C, 130T with latch outputs 136T, 136C both low.

In the subsequent read 156 of the same cell, the word line 150 and reset signals 140, 1226 are driven high, and write signal 1242 remains high. Once sufficient signal develops on the respective bit line 126C, skewed inverter 1226C drives high so that NAND gate 1228C sets latch 130C driving complementary output 136T high in pulse 162, independent of the difference on the bit line pair 126C, 126T. The cell contents are switched in the next write 154 as reflected by the high 164 on the complementary output 136C and confirmed in the following read 158 by the low going signal developing on the bit line 126C and confirmed by the high 166 on the complementary output.

Advantageously, a preferred embodiment SRAM bit select includes a dual single-ended sense that senses correct data contents and provides a selectively complementary data output signal. Further, since each of the pair of bit lines is sensed independently of the other, a preferred bit select is relatively insensitive to device mismatches. Since the dual single-ended sense paths are substantially identical, such mismatches normally only result in slight, if perceptible, timing differences between stored data states.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A bit select for a static random access memory (SRAM), said bit select comprising:
   a dual single-ended sense receiving a difference signal on a bit line pair and selectively sensing signals developing on each bit line independently of the other bit line of said bit line pair, wherein said dual single-ended sense comprises:
   a pair of inverters, each of said pair of inverters inverting a signal from a corresponding one of said bit line pair, and
   a pair of NAND gates, each of pair of NAND gates combining an output of a corresponding one of said pair of inverters with a bit select enable signal, outputs of said pair of NAND gates being said pair of single ended outputs; and
   an output driver receiving a pair of single ended outputs from said dual-ended sense and providing a pair of output signals, said pair of output signals being selectively-complementary.

2. The bit select as in claim 1, wherein said bit select is a CMOS bit select circuit.

3. The CMOS bit select as in claim 2, wherein said dual single-ended sense further comprises:
   a pair of pass gates, each of said pair of pass gates being connected between a complementary pair of data inputs and a corresponding one of said bit line pair; and
   a write driver selectively driving said pair of pass gates.

4. The CMOS bit select as in claim 3, wherein said write driver is a NOR gate NORing a write signal with a bit decode signal.

5. The CMOS bit select as in claim 4, wherein said NOR gate provides said bit select enable signal.

6. The CMOS bit select as in claim 5, wherein said NOR gate comprises:
   a CMOS inverter receiving a bit select signal and providing said bit select enable signal;
   a PFET, the source of said PFET connected to said bit select enable signal; and
   a NFET, the gate of said NFET and PFET being connected to said write signal, the drain of said NFET being connected to the drain of said PFET and selectively driving said pair of pass gates.

7. The CMOS bit select as in claim 2, further comprising:
   a pair of cross coupled PFETs, each of said cross coupled PFETs being connected between a supply voltage and one of said bit line pair; and
   a pair of reset PFETs gated by a reset select signal, each of said reset PFETs being connected between said supply voltage and one of said bit line pair.

8. The CMOS bit select as in claim 2, wherein devices in said NAND gates have a nominal design threshold voltage ($V_T$) and NFETs in each of said inverters have a threshold ($V_{T+}$) above said nominal design threshold.

9. The CMOS bit select as in claim 8, wherein said output driver comprises:
   a pair of reset PFETs gated by a reset select signal, each of said reset PFETs being connected between a supply voltage and an output of one of said pair of NAND gates.

10. The CMOS bit select as in claim 9, wherein said output further driver comprises:

a pair of latches connected to said pair of single ended outputs, NFETs in each of said pair of latches having said $V_{T+}$.

11. A CMOS static random access memory (SRAM) including an array of CMOS SRAM cells arranged in rows and columns, each of said columns including cells connected to a pair of bit lines and a bit select for said column, said bit select comprising:
a dual single-ended sense receiving a difference signal on a bit line pair and selectively sensing signals developing on each bit line independently of the other bit line of said bit line pair, wherein said dual single-ended sense comprises:
a pair of inverters, each of said pair of inverters inverting a signal from a corresponding one of said bit line pair,
two pair of two NFETs series connected between ground and a corresponding one of said pair of single ended outputs, an output of a corresponding one of said pair of inverters being connected to a corresponding gate of one of said two NFETs and a bit select enable signal being connected to another of said two; and
an output driver receiving a pair of single ended outputs from said dual-ended sense and providing a pair of output signals, said pair of output signals being selectively-complementary.

12. The CMOS SRAM as in claim 11, wherein said two pair of two NFETs have a nominal design threshold voltage ($V_T$) and NFETs in each of said inverters have a threshold ($V_{T+}$) above said nominal design threshold.

13. The CMOS SRAM as in claim 12, wherein said dual single-ended sense further comprises:
a pair of pass gates, each of said pair of pass gates being connected between a complementary pair of data inputs and a corresponding one of said bit line pair; and
a write driver selectively driving said pair of pass gates.

14. The CMOS SRAM as in claim 13, wherein said write driver NORs a write signal with a bit decode signal, said pair of pass gates being driven responsive to said NOR.

15. The CMOS SRAM as in claim 14, wherein said dual single-ended sense further comprises:
a CMOS inverter receiving a bit select signal and providing said bit select enable signal;
a PFET gated by said write signal and connected at the source to said bit select enable signal; and
a NFET gated by said write signal, the drain of said NFET being connected to the drain of said PFET and selectively driving said pair of pass gates.

16. The CMOS SRAM as in claim 15, further comprising:
a pair of cross coupled PFETs, each of said cross coupled PFETs being connected between a supply voltage and one of said bit line pair; and
a pair of reset PFETs gated by a reset select signal, each of said reset PFETs being connected between said supply voltage and one of said bit line pair.

17. The CMOS SRAM as in claim 16, wherein said output driver comprises:
a pair of reset PFETs gated by a reset select signal, each of said reset PFETs being connected between a supply voltage and an output of one of said pair of NAND gates.

18. The CMOS SRAM as in claim 17, wherein said output further driver comprises:
a pair of latches connected to said pair of single ended outputs, NEETs in each of said pair of latches having said $V_{T+}$.

19. A CMOS static random access memory (SRAM) including an array of CMOS SRAM cells arranged in rows and columns, normal NFETs in said CMOS SRAM having a nominal design threshold voltage ($V_T$) and a plurality of NFETs in said CMOS SRAM being high threshold NFETs having a threshold ($V_{T+}$) above said nominal design threshold, each of said columns including cells connected to a pair of bit lines and a bit select for said column, said bit select comprising:
a dual single-ended sense receiving a difference signal on a bit line pair and selectively sensing signals developing on each bit line independently of the other bit line of said bit line pair; and
an output driver receiving a pair of single ended outputs from said dual single-ended sense and providing a pair of output signals, said pair of output signals being selectively-complementary.

20. The CMOS SRAM as in claim 19, wherein said dual single-ended sense comprises:
a pair of inverters having said high threshold NFETs, each of said pair of inverters inverting a signal from a corresponding one of said bit line pair; and
two pair of two normal NEETs series connected between ground and a corresponding one of said pair of single ended outputs, each inverted said signal being connected to a corresponding gate of one of said two normal NFETs and a bit select enable signal being connected to another of said two.

21. The CMOS SRAM as in claim 20, wherein said dual single-ended sense further comprises:
a pair of pass gates, each of said pair of pass gates being connected between a complementary pair of data inputs and a corresponding one of said bit line pair; and
a write driver selectively driving said pair of pass gates.

22. The CMOS SRAM as in claim 21, wherein said write driver NORs a write signal with a bit decode signal, said pair of pass gates being driven responsive to said NOR.

23. The CMOS SRAM as in claim 22, wherein said dual single-ended sense further comprises:
a CMOS inverter receiving a bit select signal and providing said bit select enable signal;
a PFET gated by said write signal and connected at the source to said bit select enable signal; and
a normal NFET gated by said write signal, the drain of said normal NFET being connected to the drain of said PFET and selectively driving said pair of pass gates.

24. The CMOS SRAM as in claim 21, further comprising:
a pair of cross coupled PFETs, each of said cross coupled PFETs being connected between a supply voltage and one of said bit line pair; and
a pair of reset PFETs gated by a reset select signal, each of said reset PFETs being connected between said supply voltage and one of said bit line pair.

25. The CMOS SRAM as in claim 24, wherein said output driver comprises:
a pair of reset PFETs gated by a reset select signal, each of said reset PFETs being connected between a supply voltage and an output of one of said pair of NAND gates.

26. The CMOS SRAM as in claim 25, wherein said output driver further comprises:
a pair of latches connected to said pair of single ended outputs, NFETs in each of said pair of latches being high threshold NFETs.

* * * * *